(12) United States Patent
Moehlmann et al.

(10) Patent No.: US 8,462,032 B2
(45) Date of Patent: Jun. 11, 2013

(54) SIGMA DELTA MODULATOR

(75) Inventors: Ulrich Moehlmann, Moisburg (DE); Felix Naethe, Halstenbek (DE)

(73) Assignee: NXP B.V., Eindhoven (NL)

( * ) Notice: Subject to any disclaimer, the term of this patent is extended or adjusted under 35 U.S.C. 154(b) by 127 days.

(21) Appl. No.: 13/059,029

(22) PCT Filed: Jul. 30, 2009

(86) PCT No.: PCT/IB2009/053311
§ 371 (c)(1),
(2), (4) Date: May 9, 2011

(87) PCT Pub. No.: WO2010/018482
PCT Pub. Date: Feb. 18, 2010

(65) Prior Publication Data
US 2011/0234437 A1    Sep. 29, 2011

(30) Foreign Application Priority Data
Aug. 15, 2008    (EP) .................................. 08162458

(51) Int. Cl.
*H03M 3/00* (2006.01)
(52) U.S. Cl.
USPC .......................................... 341/143; 341/155
(58) Field of Classification Search
USPC ................................. 341/143, 155
See application file for complete search history.

(56) References Cited

U.S. PATENT DOCUMENTS

| | | | |
|---|---|---|---|
| 5,012,244 A | 4/1991 | Wellard et al. | |
| 6,768,436 B1 * | 7/2004 | Chuang | 341/143 |
| 2002/0030618 A1 * | 3/2002 | Cusinato et al. | 341/143 |
| 2004/0263365 A1 * | 12/2004 | Robinson et al. | 341/77 |

FOREIGN PATENT DOCUMENTS

| | | |
|---|---|---|
| EP | 1 202 461 A1 | 5/2002 |
| WO | 95/34955 A1 | 12/1995 |

OTHER PUBLICATIONS

Kozak, M., et al. "Rigorous Analysis of Delta-Sigma Modulators for Fractional-N PLL Frequency Synthesis", IEEE Trans. on Circuits and Systems-I: Regular Papers, vol. 51, No. 6, pp. 1148-1162 (Jun. 2004).
Wong, P. W., et al. "Two-Stage Sigma-Delta Modulation", IEEE Trans. on Acoustics, Speech and Signal Processing, vol. 38, No. 11,pp. 1937-1952 (Nov. 1990).
He, N., et al. "Double-Loop Sigma-Delta Modulation with dc Input", IEEE Trans. on Communications, vol. 38, No. 4, pp. 487-495 (Apr. 1990).
Chou, W. et al., "Multistage Sigma-Delta Modulation", IEEE Trans. on Information Theory, vol. 35, No. 4, pp. 784-796 (Jul. 1989).
Aziz, P.M., et al. "An Overview of Sigma-Delta Converters: How a 1-bit ADC achieves more than 16-bit resolution", IEEE Signal Processing Magazine, vol. 13, No. 1, pp. 61-84 (Jan. 1996).
International Search Report and Written Opinion for International Patent Application No. PCT/IB2009/053311 (Feb. 5, 2010).

* cited by examiner

*Primary Examiner* — Jean B Jeanglaude

(57) ABSTRACT

A method for driving a sigma delta modulator, a sigma delta modulator comprising at least one integrator device and one quantizer device, and a readable medium having a computer program stored thereon for performing the method are described. The method comprises setting a sigma delta modulator to an irrational operation mode. The method comprises monitoring at least one output signal of the sigma delta modulator. The method comprises resetting the sigma delta modulator to the irrational operation mode depending on the monitored output signal.

19 Claims, 5 Drawing Sheets

SIGMA DELTA MODULATOR

FIELD OF THE INVENTION

The present application relates to a method for driving a sigma delta modulator. The present application relates also to a sigma delta modulator comprising at least one integrator device and one quantizer device and it relates to a readable medium having a computer program stored thereon for performing said method.

BACKGROUND OF THE INVENTION

Due to the developments in CMOS technology, sigma delta modulators are widely used nowadays. Sigma delta modulator can be employed for audio signal applications, in receiver devices, such as mobile phones, and the like.

FIG. 1 shows a first embodiment of a sigma delta modulator according to prior art. As can be seen from this Figure, an input signal x[n] can be received via an input terminal 6 by an integrator device 2. The integrator device comprises an adding unit and a delay unit 3. The output signal v[n] of the integrator device 2 is fed via connection 8 to a quantizer device 4, which comprises an output terminal 10. The integrator device 2 receives as the input signal the difference value between the input signal x[n] and the output signal of the quantizer device 4.

In addition, the order of a sigma delta modulator is defined by the number of provided integrators. For instance, the sigma delta modulator according to FIG. 1 is a first order sigma delta modulator. To increase the order of the sigma delta modulator, several approaches are known. For instance, as shown in FIG. 2, the integrators 2 can be cascaded with one quantizer device 4 in a single structure. Additionally, comparing units 12 can be arranged.

Another possibility of a higher order sigma delta modulator is shown in FIG. 3. This Figure shows a multistage noise shaping (MASH) structure. A plurality of integrator devices each connected to a quantization device is arranged in cascaded form. The arrangement of an integrator device and a quantizer device 4 is also called a stage of the sigma delta modulator. The quantization error can be expressed by addition of white Gaussian noise (AWGN) sources (not shown). The output of each stage is fed to an error cancellation network 24. The error cancellation network 24 comprises delay units 18.1 and 18.2 and delay units 20. The number of delay cells in a delay unit 18.1 or 18.2 for a certain stage is N-n, wherein N is the order of the sigma delta modulator and n is the number of the respective stage. The error cancellation network 24 may be configured to reduce the quantization error.

The previously described embodiments of a sigma delta modulator according to prior art comprise the basic issue that their output spectra have spurious frequencies. In the present context spurious frequencies may be regarded as frequencies with an amplitude that is significantly higher than the noise spectrum of the sigma delta modulator. Such frequencies may cause problems in several applications. By way of example, in case the sigma delta modulator is used in a PLL, wherein the PLL is a local oscillator within a tuner system, spurious frequencies may yield to spurious reception. According to a further example, if the PLL is employed as a clock source for an analogue digital converter (ADC) or digital analogue converter (DAC), spurious frequencies may cause spurious tones or whistles.

For preventing spurious frequencies in the output spectrum of a sigma delta modulator according to prior art, in particular a sigma delta modulator having the order three or higher and a constant input value or signal, three conditions must be fulfilled. The first condition is that the bit width is large enough for good approximation of an irrational starting condition and long repetition period. The second condition is that the superposition of the output signals of the sigma delta modulator stages is performed with proper phase relation in the error cancellation network. The third condition is that an irrational starting condition is given.

The first and the second conditions can be fulfilled, for instance, by the implementation of a sigma delta modulator according to the embodiment shown in FIG. 3. The irrational starting condition may result in that the value cannot be calculated from a fraction of integers and is a decimal which does not comprise a periodic fractional part. The successful operation of sigma-delta modulator relies on the assumption that the successive input samples are uncorrelated. In case of constant input values, an irrational starting condition may cause an irrational operation mode resulting in a spurious free output spectrum. More particularly, an irrational starting condition or irrational operation mode may be very effective in randomizing the binary quantization error, and thus, spurious frequencies can be prevented.

However, during runtime of the sigma delta modulator, its operation mode can be changed from an irrational operation mode to a rational operation mode. In particular, due to disturbances, such as electrostatic discharge, power dip, cosmic or radioactive radiation, the phase relation between at least two stages can be destroyed or the system can go into another operation mode generating an output spectrum with spurious frequencies.

Therefore, it is one object of the present application to provide a method for preventing negative effects caused by disturbances during the runtime of the sigma delta modulator. Another object is to prevent spurious frequencies in an output spectrum of a sigma delta modulator. A further object of the present application is to prevent destroying of phase relation.

SUMMARY OF THE INVENTION

These and other objects are solved by a method comprising setting a sigma delta modulator to an irrational operation mode. The method comprises monitoring at least one output signal of the sigma delta modulator. The method comprises resetting the sigma delta modulator to the irrational operation mode depending on the monitored output signal.

The present method can be used for any kind of sigma delta modulators, such as a sigma delta modulator implemented in a single structure, MASH structure or the like. In particular, the present method can be employed for any sigma delta modulator structures which can fall into a spurious operation mode during runtime.

According to the present method, the sigma delta modulator is set to an irrational operation mode. In particular, the sigma delta modulator can be set to an irrational operation mode each time the sigma delta modulator is activated or started. Thereby, the irrational operation mode comprises an irrational starting condition. Setting the sigma delta modulator to an irrational operation mode may include merely setting a particular stage or integrator device or all stages or integrator devices or the total circuit with additional components, like controlling units or the like, to an irrational operation mode. In particular, the integrator or accumulator of the first stage of a multistage sigma delta modulator can be set to the irrational starting condition causing that the sigma delta modulator can be operated in the irrational operation mode.

It is found according to the present application that a change of the operation mode from spurious free operation mode to an spurious operation mode during runtime due to any kind of disturbance can be prevent by monitoring at least one output signal of the sigma delta modulator. It shall be understood that more than one output signal can be monitored. By way of example, in case the sigma delta modulator is implemented as a MASH structure, the output signal of each stage or the output signal of one, two or all integrator devices can be monitored.

Depending on the monitored result, the sigma delta modulator may be reset to the irrational operation mode. More particularly, in case a disturbance and/or instability is/are monitored, the sigma delta modulator can be reset to the irrational operation mode. Resetting the sigma delta modulator may include resetting merely a particular stage or integrator device, all stages or integrator devices or the total circuit. In particular, the integrator or accumulator of the first stage of a multistage sigma delta modulator can be reset to the irrational starting condition causing that the sigma delta modulator can be operated in the irrational operation mode.

The present method may provide for that any kinds of disturbance do not effect or at least to a less degree the operation of a sigma delta modulator. Furthermore, an output spectrum without spurious frequencies can be ensured by the present method.

According to a further embodiment of the present application, monitoring the output signal of the sigma delta modulator may comprise monitoring states of the sigma delta modulator. The sigma delta modulator or the respective stage or integrator device may output states and digital values respectively during its runtime, which can be monitored. A simple monitoring process can be ensured.

Furthermore, the method according to another embodiment comprises that the output signal of the sigma delta modulator may be monitored periodically and/or continuously. Monitoring the output signal and/or states of the sigma delta modulator periodically reduces processing time while monitoring the output signal and/or states of the sigma delta modulator continuously improves the accuracy. It shall be understood that a suitable middle course can be chosen.

For enabling to determine in a simple manner whether the sigma delta modulator has to be reset to the irrational operation mode, the method according to another embodiment of the present application may comprise analysing the monitored output signal. Analysing the monitored output signal and/or states of the sigma delta modulator may include detecting disturbances, instabilities or any anomalies of the monitored states and output signals respectively.

According to a further embodiment of the present application, analysing the monitored output signal may comprise comparing the monitored states of the sigma delta modulator with states stored in a list. It is found that an unwanted change of the operation mode from a spurious free operation mode to a spurious operation mode can be detected by comparing the monitored states with states, which are stored in a list. For instance, a lookup-table can be employed. In the list, the states which are expected to occur can be stored. Then the sigma delta modulator can be reset to the irrational operation mode in case at least a deviation between one monitored state and stored states is detected. It shall be understood that according to further variants of the present application it may be required for resetting the sigma delta modulator that more than one monitored state has to differ from expected stored states or that the deviation between monitored and stored states must increase a predefined threshold value. The correction and resetting respectively can be performed directly after monitoring and comparing the respective state. In other words, a delay for correction does not occur in principle since the sigma delta modulator can be reset directly after detecting a disturbance.

It is further found that calculation time as well as memory space can be saved if a repetition rate of the sigma delta modulator is determined, and if it is determined whether a monitored repetition rate differs from the determined repetition rate. In other words, it can be checked by the present method whether a certain state appears after a certain period or a certain number of cycles, like the repetition rate. Merely the state, which is expected to occur after the certain period, can be stored. At first, the repetition rate can be determined by monitoring the sigma delta modulator, in particular, directly after activating. It may be also possible that the repetition rate is already known or constant for all input values, and thus, monitoring the sigma delta modulator for determining the repetition rate can be omitted. By way of example, the input values may be rational dc input values. Determining whether a monitored repetition rate differs from the determined repetition rate includes checking whether the monitored repetition rate is too short, too large or not found. Or in other words, it can be checked if an expected state occurs at an expected time point. If the expected state does not appear, the sigma delta can be reset.

It may be possible that the used sigma delta modulator comprises a settling phase after setting or resetting the sigma delta modulator to an irrational operation mode. According to a further embodiment, the actual state after the settling phase can be stored, and the sigma delta modulator can be monitored whether the stored state appears after a certain period, in particular, after the repetition rate. A settling phase can be taken into account by simple means, if necessary.

According to a further embodiment of the present application, an input signal may be received by the sigma delta modulator, and the sigma delta modulator can be reset to the irrational operation mode in case the input signal changes. The input signal or the input value may be constant or unchanged for a certain period or a plurality of cycles. It is found that for preventing an unwanted change of the operation mode, the sigma delta modulator can be reset to the irrational operation mode in case the input signal or the input value changes. In particular, the total circuit can be reset in this case.

Another aspect of the present application is a sigma delta modulator comprising at least one integrator device. The sigma delta modulator comprises at least one quantizer device being connected to the integrator device. The sigma delta modulator comprises at least one monitoring device configured to monitor an output signal of the sigma delta modulator. The sigma delta modulator comprises at least one resetting device configured to reset the sigma delta modulator to an irrational operation mode depending on the monitored output signal of the sigma delta modulator.

The sigma delta modulator according to the present application comprises at least an integrator and a quantizer. The integrator may be also implemented as an accumulator in a digital domain. It shall be understood that the present sigma delta modulator may comprise more of these devices and may be implemented in a single structure, MASH structure and the like.

It is found that a monitoring device can be arranged for monitoring the output signal of the sigma delta modulator, which may include monitoring an output signal of at least one stage of the sigma delta modulator or the output signal of the at least one integrator. Any suitable monitoring device can be implemented. The monitoring device may be in communication with a resetting device. The resetting device may be configured to reset the sigma delta modulator to an irrational operation mode depending on the monitored output signal of the sigma delta modulator. The resetting device can be connected to the respective stages, integrator devices and the like for resetting these devices or stages. In particular, these devices can be reset by supplying these devices with an irrational starting condition.

The present sigma delta modulator provides for that effects caused by any kind of disturbance do not effect the operation of the sigma delta modulator. The present sigma delta modulator may generate an output spectrum without spurious frequencies.

According to another embodiment of the present application, the sigma delta modulator may further comprise an analysing device configured to analyse the monitored output signal. The analysing device may be any suitable processing device, like a digital signal processor (DSP). The analysing, monitoring and resetting devices can be included within a single device, like the suitable processing device. A simple possibility for analysing and detecting an unwanted operation mode change is ensured.

Furthermore, the sigma delta modulator according to a further embodiment of the present application may comprise at least one storing device configured to store at least one expected state, a repetition rate, a look-up table and/or a settling phase. The storing device can be included within or connected to the analysing device. Any suitable storing device can be used. The stored data can be used for analysing the monitored output signal or states of the sigma delta modulator. By way of example, an expected state stored after a repetition rate and/or a settling phase can be compared with the actually monitored state. If a deviation is detected by the analysing device, the analysing device may be configured to control the resetting device for resetting at least parts of the sigma delta modulator to the irrational operation mode.

For improving the quality of the output spectrum, in particular, for reducing the quantization error, the sigma delta modulator according another embodiment of the present application may comprise an error cancellation network. The error cancellation network may comprise delay cells and subtracting devices for reducing the quantization error. An error cancellation network may be in particular suitable for a sigma delta modulator implemented as a MASH structure.

Another aspect of the present application is a mobile device comprising the previously stated sigma delta modulator.

Another aspect of the present application is a computer readable medium having a computer program stored thereon. The computer program comprises instructions operable to cause a processor to perform the above mentioned method. It may also be possible to implement the program on a microprocessor or being hardwired on a chip.

These and other aspects of the present patent application become apparent from and will be elucidated with reference to the following figures. The features of the present application and of its exemplary embodiments as presented above are understood to be disclosed also in all possible combinations with each other.

BRIEF DESCRIPTION OF THE DRAWINGS

In the figures show.

DETAILED DESCRIPTION OF THE DRAWINGS

In the following detailed description of the present application, exemplary embodiments of the present application will describe and point out a method, which provides for preventing negative effects caused by disturbances during the runtime of the sigma delta modulator, an improved sigma delta modulator generating an output spectrum without spurious frequencies.

Figure 1:
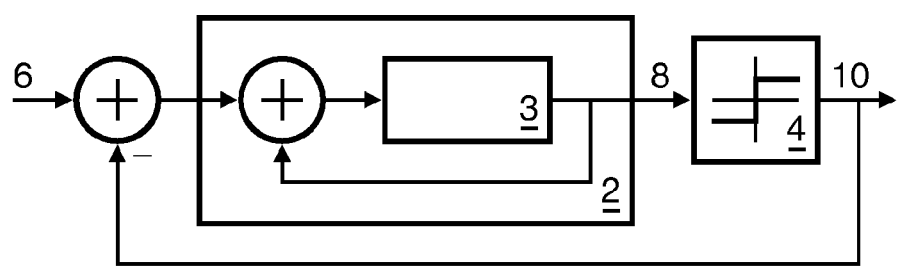
FIG. 1 a first embodiment of a sigma delta modulator according to prior art.
Figure 2:
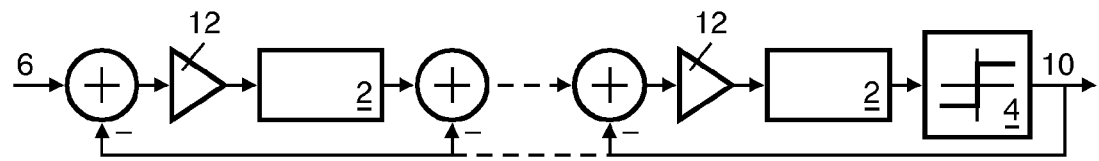
FIG. 2 a second embodiment of a sigma delta modulator according to prior art.
Figure 3:
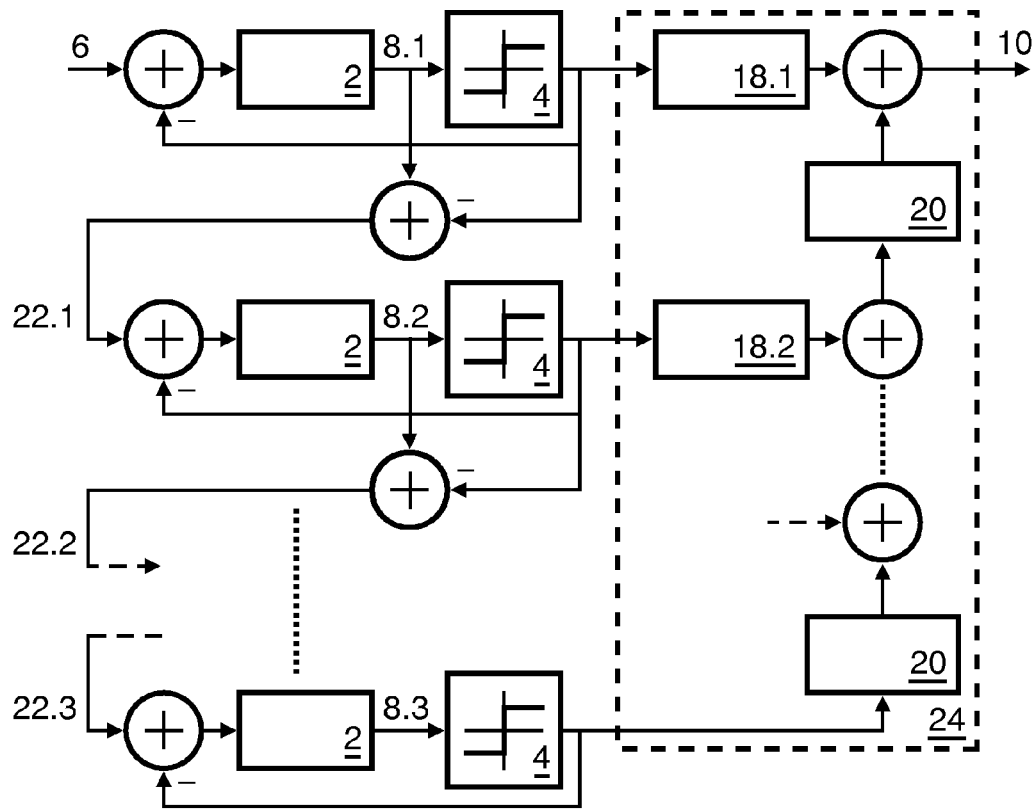
FIG. 3 a third embodiment of a sigma delta modulator according to prior art.
Figure 4:
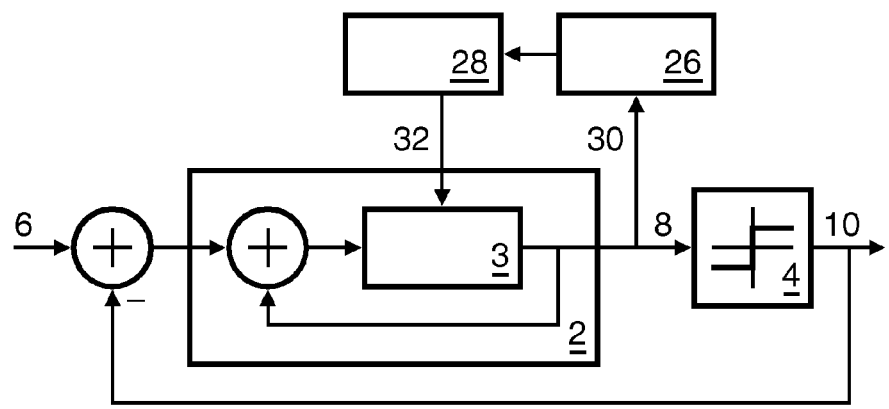
FIG. 4 a first embodiment of the sigma delta modulator according to the present application.

FIG. 4 shows a first simplified embodiment of the sigma delta modulator according to the present application. For avoiding repetitions, merely the differences of the present sigma delta modulator compared to the sigma delta modulator of prior art, as depicted in FIG. 1, are elucidated.

As can be seen from FIG. 4, the sigma delta modulator according to an embodiment of the present application comprises a monitoring device 26 and a resetting device 28. The monitoring device 26 is in communication with the resetting device 28. It may also be possible that these devices are formed as a single device, like a suitable processing unit. Furthermore, the monitoring device 26 is configured to monitor or measure the output signal of the integrator device 2 via a connection 30. The monitored output signal may comprise digital values or states. It shall be understood that according to other variants, other output signals or states of the sigma delta modulator can be additionally or solely monitored. Depending on the measured values the resetting device 28 is configured to reset the sigma delta modulator, in particular the integrator device, to an irrational operation mode via a connection 32. A more detailed elucidation of the functioning of the present sigma delta modulator follows.

Figure 5:
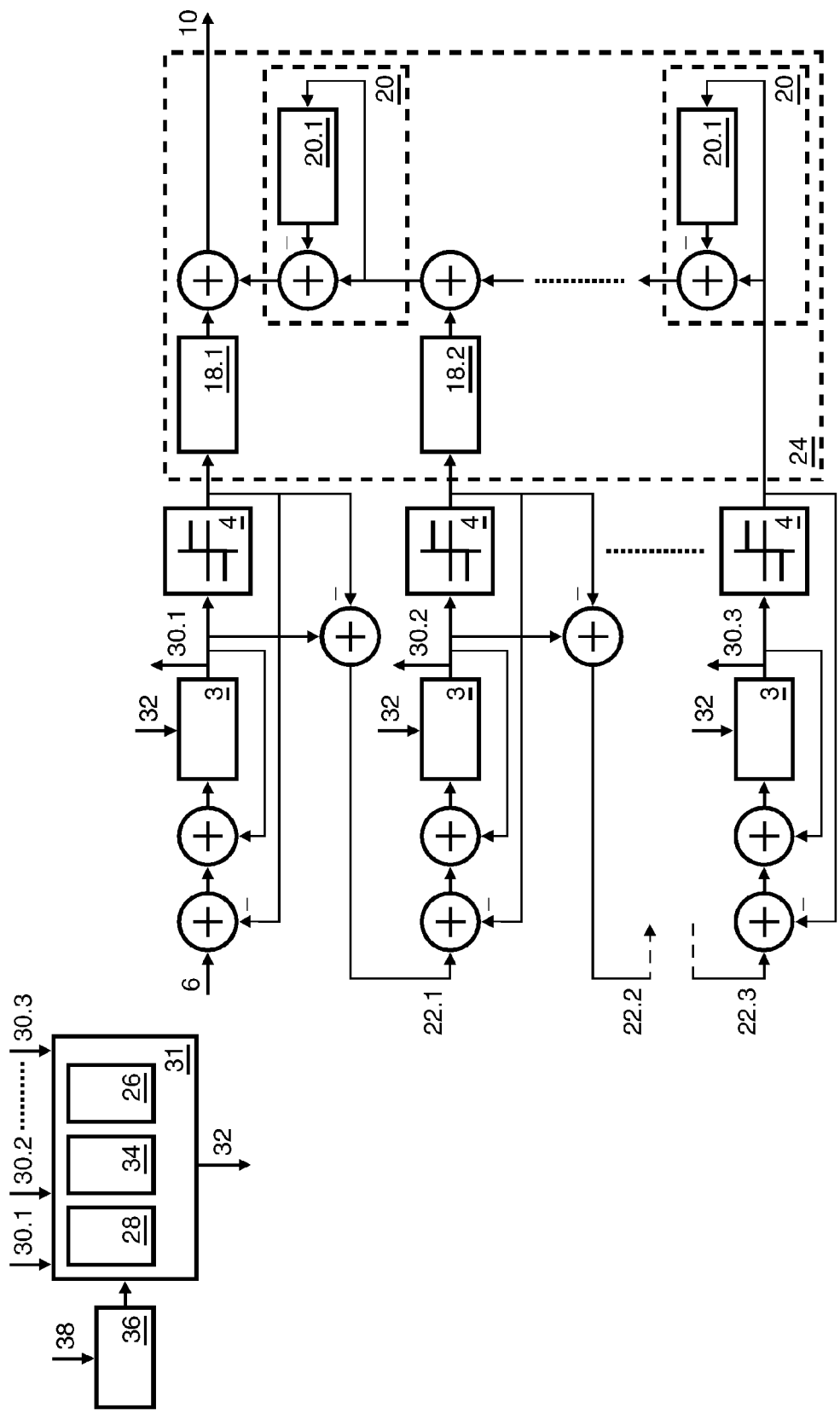
FIG. 5 a second embodiment of the sigma delta modulator according to the present application.

In FIG. 5, a more detailed second embodiment of the sigma delta modulator according to the present application is shown. The sigma delta modulator according to FIG. 5 is implemented in a MASH structure and comprises an error cancellation network 24. Thereby, the error cancellation network 24 comprises delay units 18.1, 18.2 and 20, wherein the delay unit 20 comprises a delay cell 20.1 and subtracting devices. The error cancellation network 24 may be configured for at least reducing the quantization error.

It is noted that different MASH structures are within the scope of this application. Any other sigma-delta structure implementing the inventive resulting are also within the scope. Also, operation in relation modes may be possible.

Furthermore, a protection circuit 31 is depicted. The present protection circuit 31 comprises three devices 26, 28 and 34. Besides the previously mentioned monitoring device 26 and the resetting device 28, an analysing device 34 is arranged within the protection circuit 31. It shall be understood that, according to further variants of the present application, these three devices 26, 28 and 34 can be realised by a suitable processing unit, such as a digital signal processor (DSP). The protection circuit 31 is configured to receive a plurality of input signals. More particularly, a plurality of connections 30.1 to 30.3 can be arranged for receiving the output signals of the respective integrator devices or delay units 3 of the integrator devices.

In addition, a counting device 36 is connected to the protection circuit 31. The counting device 36 can be arranged for counting the cycles. More particularly, a repetition rate and/or settling phase of the sigma delta modulator can be determined and observed by the provided counting device 36.

Moreover, the protection circuit 31 and resetting device 28 respectively are configured to reset the sigma delta modulator, in particular the integrator device 2 or delay units 3, to an irrational operation mode depending on the analysing results via a connection 32. The protection circuit 31 and resetting device 28 can be connected to each of the arranged delay units 3 of the integrator device. It shall be understood that the protection circuit 31 can be in communication to further components for resetting or controlling the respective devices. By way of example, the protection circuit 31 can be connected to the counting device 36 via terminal 38.

It shall be noted that delay units 3 may also be arranged within the respective feedback path, in which case elements 18.1, 18.2 may be omitted.

Figure 6:
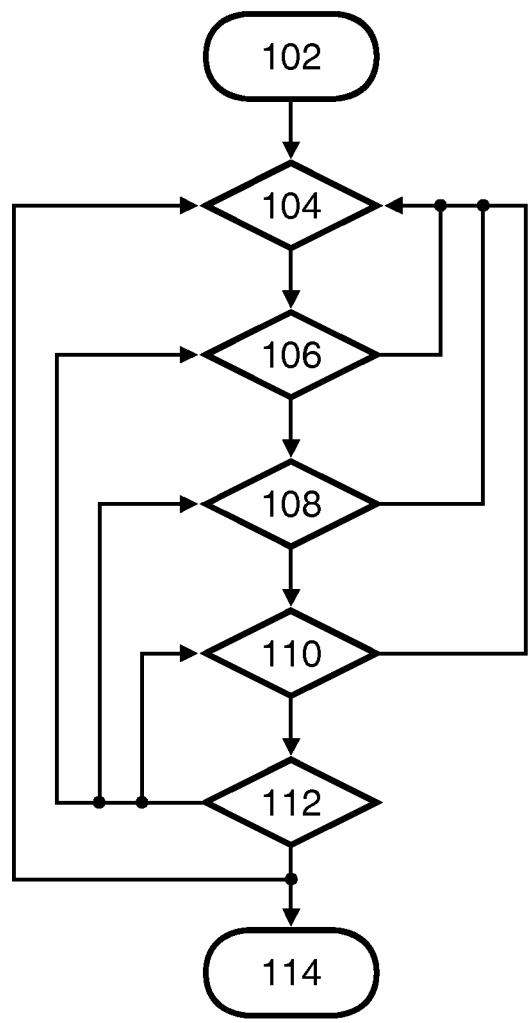
FIG. 6 a flowchart of the method according to the present application.

In the following, the functioning of the sigma delta modulator according to the present application will be pointed out by the aid of FIGS. 4 to 6. Thereby, FIG. 6 shows an exemplified flowchart of the method according to the present application.

After the method is started in the first step 102, all blocks or components of the sigma delta modulator are set into the irrational operation mode in step 104. In other words, the whole circuit, as e.g. shown in FIG. 5, is set to an irrational operation mode. The irrational operation mode includes an irrational starting condition. The resetting device 26 may be configured to generate such an irrational starting condition.

One possibility to obtain such a starting condition in a digital circuit is to use the following equations:

$$\text{irr\_val} = \sqrt{\frac{m+1}{m}} \text{ mod}1, \text{ with } m \geq 1, \quad (a)$$

$$\text{start\_val} = \text{int\_val}[\text{irr\_val} \cdot 2^p]. \quad b)$$

Thereby, int_val represents an arbitrary integer value. The above presented approximations a and b achieve suitable results. In particular, these approximations a and b achieve suitable results for the case that the value of p is large. By way of example, m=1 gives the irrational value irr_val=$\sqrt{2}$.

In a next step 106, it may be possible that a settling phase may be accomplished. After the settling phase, the current state of the sigma delta modulator can be stored into a suitable storing device (not shown). However, step 106 can be also omitted. This may depend on the particular implementation of the sigma delta modulator. By way of example, in a MASH-111 structure, the settling phase is obsolete since the reset values of the stages are part of the period. In this case, step 106 is not required.

Furthermore, in a next step 108, after a possible settling phase is completed, the repetition rate of the sigma delta modulator can be monitored by the monitoring device 26. More particularly, the repetition rate and the clock cycle at which the values repeat can be monitored. It shall be understood that, according to other variants of the present application, this step 108 can be omitted. For instance, if the repetition rate is known and/or constant for all input values, monitoring the repetition rate is obsolete. If a repetition rate is not found, it is continued with step 104.

In the following step 110, the sigma delta modulator can be monitored and checked by the monitoring device 26. This can be performed periodically and/or continuously. One possibility is to monitor all states of the sigma delta modulator and to check whether all the monitored states are states of a list that are passed periodically. A lookup-table can be stored in suitable storing means and the respective values can be compared using the lookup-table. In case, at least one state differs from an expected state, the sigma delta modulator or at least parts of the sigma delta modulator, like the stage responsive for a detected deviation, can be reset by the resetting device 28 directly in step 112.

Another possibility is to monitor and check whether a certain state, which may be either the reset state or a state which has been stored into the storing device after completing the settling phase, can be found after a particular number of states and the repetition rate respectively. This possibility may save processing time and storing space. However, it shall be understood that both possibilities can be also used in a suitable combination.

Depending on the analyzing results, it may be required to reset the sigma delta modulator. In case the values monitored by the monitoring device 26 differ from the expected values, the sigma delta modulator is reset by the resetting device in step 112. More particularly, in case the repetition rate is too short, too large or not found, or in other words, the expected state deviates from the actually monitored state in its value or its occurrence time point, the sigma delta modulator is reset by the resetting device in step 112 into the irrational operation mode. An unwanted operation mode change during the runtime of the sigma delta modulator can be surely avoided. In general all stages of the sigma delta modulator are reset. However, it shall be understood that it may be also possible to reset merely certain stages.

After resetting the sigma delta modulator, the next step may depend on the chosen options. In case, a settling phase is required, it can be forwarded to step 106. If merely the repetition rate must be monitored, it can be continued with step 108. In the case, both options are obsolete, it can be returned to step 110 and the sigma delta modulator can be further observed.

Another possibility is that the total system must be reset. This can be done if the repetition rate fails a certain number of times consecutively. The number of time can be predefined and may be at least two or larger. If the input value applied at terminal 6 of the sigma delta modulator changes, the complete circuit is reset as well. It shall be understood that this can be performed if the circuit is in the settling mode (step 106) or about to monitor the repetition rate (step 108). Thus, the time interval with probably spurious operation can be minimized.

Finally, the method can be terminated in a last step 114.

In the following, the output spectra of a sigma delta modulator according to prior art and the sigma delta modulator according to the present application are compared. While FIG. 7 shows an exemplified output spectrum of a sigma delta modulator according to prior art, FIG. 8 shows an exemplified output spectrum of the sigma delta modulator according to the present application.

Figure 7:
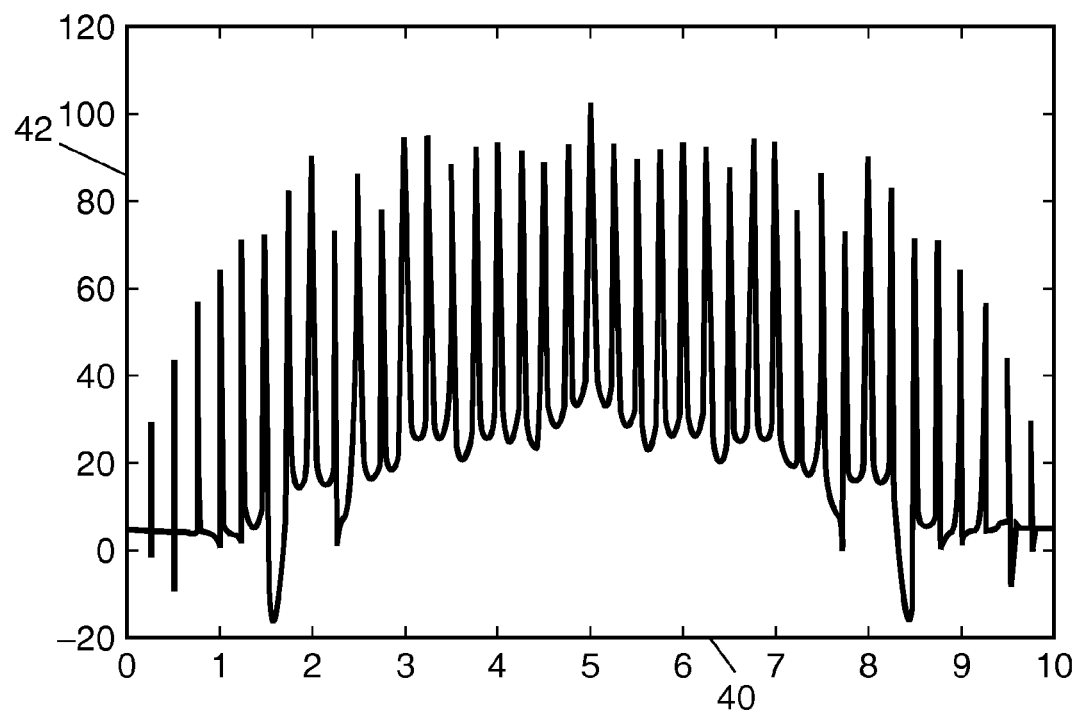
FIG. 7 an exemplified output spectrum of a sigma delta modulator according to prior art.
Figure 8:
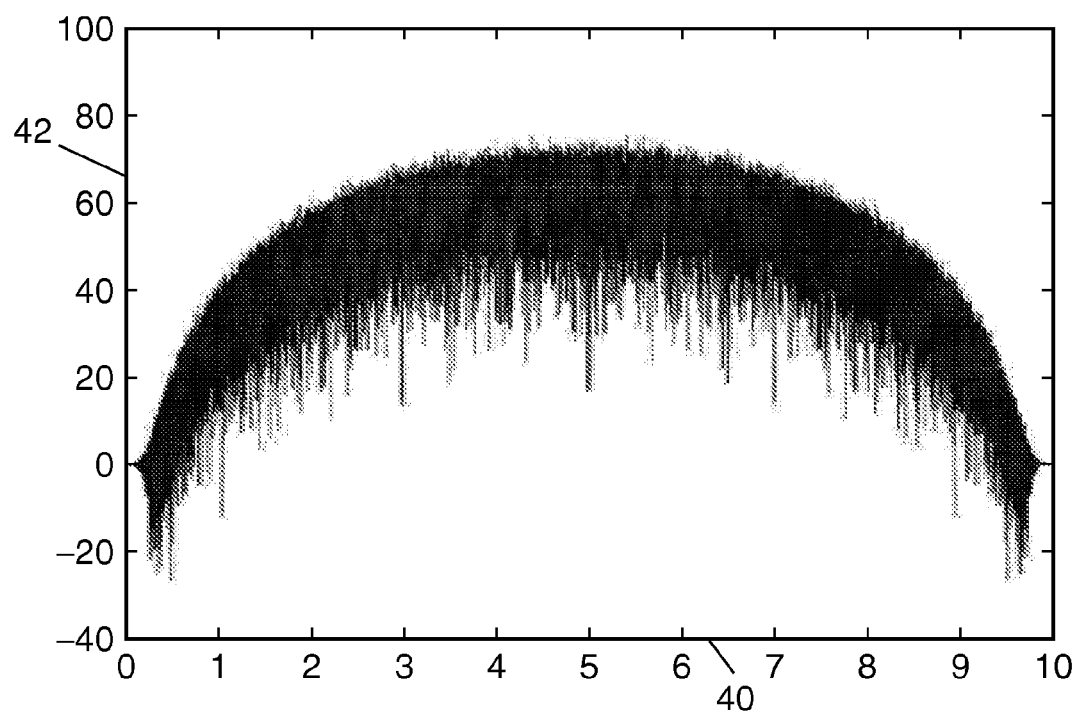
FIG. 8 an exemplified output spectrum of the sigma delta modulator according to the present application;
Like reference numerals in different figures indicate like elements.

Thereby, reference sign 42 indicates in both FIGS. 7 and 8 the amplitude in dB and reference sign 40 indicates the frequency in $10^4$ Hz. As can be seen from FIG. 7, the output spectrum comprises spurious frequencies. In contrary thereto, the output spectrum depicted in FIG. 8 is spurious free.

Furthermore, it is readily clear for a person skilled in the art that the logical blocks in the schematic block diagrams as well as the flowchart presented in the above description may at least partially be implemented in electronic hardware and/or computer software, wherein it depends on the functionality of the logical block, flowchart step and on design constraints imposed on the respective devices to which degree a logical block or a flowchart step is implemented in hardware or software. The presented logical blocks and flowchart steps may for instance be implemented in one or more digital signal processors, application specific integrated circuits, field programmable gate arrays or other programmable devices. The computer software may be stored in a variety of storage media of electric, magnetic, electro-magnetic or optic type and may be read and executed by a processor, such as for instance a microprocessor. To this end, the processor and the storage medium may be coupled to interchange information, or the storage medium may be included in the processor.

The invention claimed is:

1. A method, comprising:
   setting a sigma delta modulator to an irrational operation mode,
   monitoring at least one output signal of the sigma delta modulator, and
   resetting the sigma delta modulator to the irrational operation mode according to a value of the monitored output signal.

2. The method according to claim 1, wherein monitoring the output signal of the sigma delta modulator comprises monitoring states of the sigma delta modulator.

3. The method according to claim 1, wherein the output signal of the sigma delta modulator is monitored at least one of:
   A) periodically,
   B) continuously.

4. The method according to claim 1, further comprising analysing the monitored output signal.

5. The method according to claim 4, wherein analysing the monitored output signal comprises comparing the monitored states of the sigma delta modulator with states stored in a list.

6. The method according to claim 5, further comprising resetting the sigma delta modulator to the irrational operation mode in case at least a deviation between one monitored state and one stored state is detected.

7. The method according to claim 4, wherein analysing the monitored output signal comprises:
   determining a repetition rate of the sigma delta modulator, and
   determining whether a monitored repetition rate differs from the determined repetition rate.

8. The method according to claim 4, wherein analysing the monitored output signal comprises
   storing the actual state after a settling phase, and
   monitoring the sigma delta modulator to determine whether the stored state appears after a certain period.

9. The method according to claim 1, further comprising:
   receiving an input signal by the sigma delta modulator, and
   resetting the sigma delta modulator to the irrational operation mode in case the input signal changes.

10. A sigma delta modulator, comprising:
    at least one integrator device,
    at least one quantizer device connected to the integrator device,
    at least one monitoring device configured to monitor an output signal of the sigma delta modulator, and
    at least one resetting device configured to reset the sigma delta modulator to an irrational operation mode according to a value of the monitored output signal of the sigma delta modulator.

11. The sigma delta modulator according to claim 10, further comprising an analysing device configured to analyse the monitored output signal.

12. The sigma delta modulator according to claim 10, further comprising at least one storing device configured to store at least one of:
    A) an expected state,
    B) a repetition rate,
    C) a look-up table, and
    D) a settling phase.

13. The sigma delta modulator according to claim 10, further comprising an error cancellation network.

14. A mobile device comprising the sigma delta modulator according to claim 10.

15. A computer readable medium having a computer program stored thereon, the computer program comprising:
    instructions operable to cause a processor to perform a method according to claim 1.

16. The sigma delta modulator of claim 11, wherein the analysing device is further configured to compare the monitored states of the sigma delta modulator with states stored in a list.

17. The sigma delta modulator of claim 16, wherein the at least one resetting device is further configured to reset the sigma delta modulator to the irrational operation mode in case at least a deviation between one monitored state and one stored state is detected.

18. The sigma delta modulator of claim 11, wherein the analysing device is further configured to:
    determine a repetition rate of the sigma delta modulator, and
    determine whether a monitored repetition rate differs from the determined repetition rate.

19. The sigma delta modulator of claim 11, wherein the analysing device is further configured to:
    store the actual state after a settling phase, and
    monitor the sigma delta modulator to determine whether the stored state appears after a certain period.

* * * * *